United States Patent [19]

Mori

[11] 4,313,107
[45] Jan. 26, 1982

[54] TONE SIGNAL DETECTORS
[75] Inventor: Toshihiro Mori, Tokyo, Japan
[73] Assignee: Nippon Electric Co., Ltd., Tokyo, Japan
[21] Appl. No.: 972,176
[22] Filed: Dec. 21, 1978
[30] Foreign Application Priority Data
  Dec. 23, 1977 [JP] Japan .............. 52-174744[U]
[51] Int. Cl.² .................. H04Q 9/00; H04M 11/02; G01R 23/02
[52] U.S. Cl. .................. 340/825.71; 324/78 D; 340/311.1; 340/825.48
[58] Field of Search .............. 340/171 R, 168 B, 311; 324/78 D, 79 D

[56] References Cited
U.S. PATENT DOCUMENTS
  4,023,105  5/1977  Wolling, Jr. ............ 340/168 R
  4,142,177  2/1979  Davis .................. 340/171 R

*Primary Examiner*—Donald J. Yusko
*Attorney, Agent, or Firm*—Sughrue, Mion, Zinn, Macpeak and Seas

[57] ABSTRACT

A tone signal detector for use in paging receivers, transceivers, mobile radio equipment and the like is disclosed. Received tone signals are waveform-converted to generate complementary gating pulses. These gating pulses are used to gate clock pulses to one of two counters, each of which produce a detecting pulse upon counting up to a predetermined number during a predetermined time interval. A detecting pulse from one counter resets the other, and a detecting pulse from either enables a third counter to count clock pulses. This third counter will produce a detecting pulse upon counting up to a predetermined number during a predetermined time interval. The first and second counters enable the tone signal detector to yield detecting pulses without being adversely affected by threshold variations in the waveform converting circuit, while the third counter examines frequency deviation of incoming tone signals.

3 Claims, 7 Drawing Figures

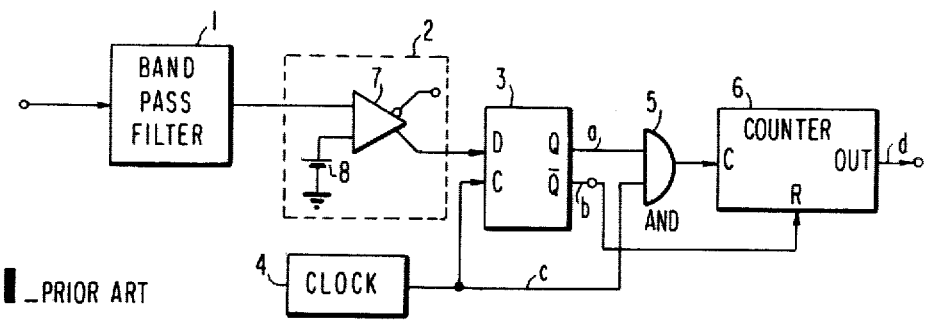
FIG. 1 — PRIOR ART
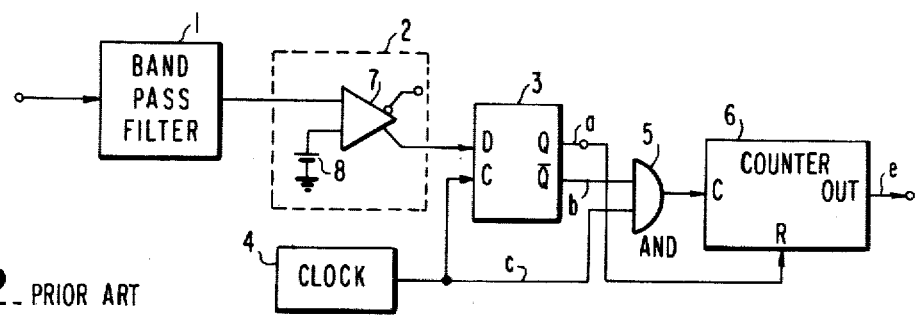
FIG. 2 — PRIOR ART
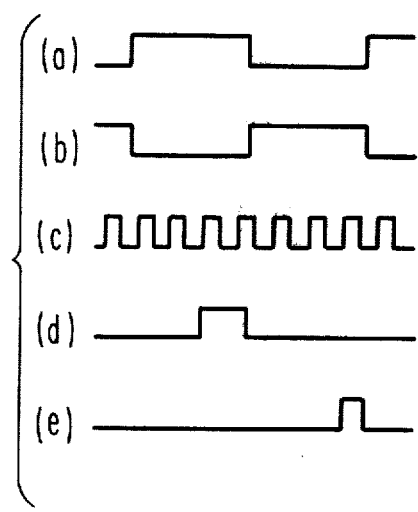
FIG. 3
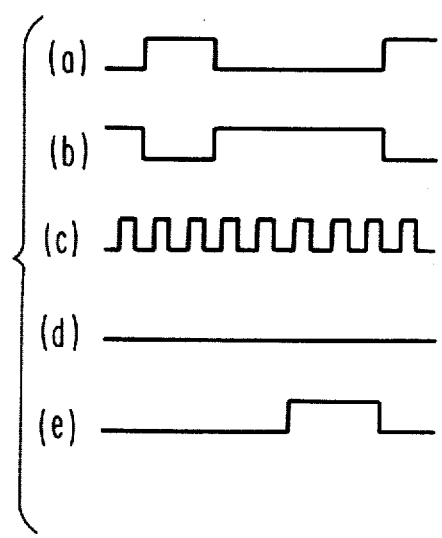
FIG. 4

TONE SIGNAL DETECTORS

FIELD OF THE INVENTION

This invention relates to tone signal detectors for use in paging receivers, transceivers, mobile radio equipments and the like.

BACKGROUND OF THE INVENTION

Several tone signal detectors have been proposed for detecting the presence of predetermined tone signals. One of such detectors, which is disclosed in the inventor's copending patent application, Ser. No. 854,868, filed Nov. 25, 1977, includes a waveform converting circuit for converting incoming tone signals into pulses which are applied, as gating pulses, to a suitable gate circuit. The gate circuit responds to the gating pulse and selectively permits clock pulses having a high repetition rate to be applied to a counter. The counter yields a tone signal detecting pulse only upon counting the clock pulses up to a predetermined number during a predetermined time interval. The detector also detects tone signals each having a predetermined period for the purpose of noise suppression.

The tone signal detector, however, has encountered a problem: a threshold in the waveform converting circuit is liable to vary, resulting in variations of duty factor of the gating pulse, so that the detector is subject to failure in predetermined tone signals.

For a better understanding of this invention, reference is made to FIGS. 1-4 of the accompanying drawings, wherein FIGS. 1 and 2 are schematic illustrations of conventional tone signal detectors and FIGS. 3 and 4 are time charts illustrating proper and improper operations, respectively, of the detectors of FIGS. 1 and 2.

A difference between the circuit configurations of FIGS. 1 and 2 is that one input terminal of AND gate 5 of the former is coupled to the Q output of a flip-flop 3, not to the $\bar{Q}$ output as in the latter. To begin with, it is assumed that a waveform converting circuit 2 maintains its threshold at a proper level, so that the flip-flop 3 produces complementary pulses each having proper duty factors as shown in FIG. 3.

A tone signal is applied, through a band-pass filter 1, to the waveform converting circuit 2 (for example, a voltage comparator comprising a differential amplifier 7 and a reference voltage source 8). The waveform converting circuit 2 compares the voltage of the incoming tone signal with the reference voltage to produce a rectangular wave signal. The output of the waveform converting circuit 2 is fed to the D input of the flip-flop 3 (a D type flip-flop, for example). The flip-flop 3 also receives, at its C input, clock pulses "c" from a clock pulse generator 4 to synchronize the output signal of the waveform converting circuit 2 with the clock pulses "c". Pulses "a" and "b" developed, respectively, at a Q output and $\bar{Q}$ output (FIGS. 1 and 2) are then fed as gating pulses to the AND gate 5. The AND gate 5 responds to the gating pulse and selectively allows the clock pulses "c" to be applied to the next stage, viz., a counter (in this case, a ternary counter) 6. The counter 6 counts the clock pulses and produces a detecting pulse "d" or "e" at its output OUT every three pulses counted. The pulse "b" (FIG. 1) or "a" (FIG. 2) resets the counter 6.

Under the above assumption, either of the circuit arrangements of FIGS. 1 and 2 is practical. However, when the pulse developed at the Q or $\bar{Q}$ output varies in its duty factor as shown in FIG. 4 due to the undesirable changes of the threshold, the detector of FIG. 1 or 2 cannot properly detect the presence of predetermined tone signals.

In the above, when the output of the waveform converting circuit 2 is not necessarily synchronized with the clock pulses "c", the flip-flop 3 can be omitted, wherein the inverting or non-inverting output of the differential amplifier 7 is directly connected to the AND gate 5.

It is therefore a primary object of this invention to provide an improved tone signal detector which yields detecting pulses without being adversely affected by threshold variations in the waveform converting circuit.

A further object of this invention is to provide an improved tone signal detector which examines frequency deviation of incoming tone signals and detecting the presence of tone signals each having a predetermined period.

SUMMARY OF THE INVENTION

According to this invention, a tone signal detector for detecting the presence of predetermined tone signals, comprises first means for waveform-converting said tone signals to generate complementary gating pulses; second means for generating clock pulses; third means coupled to both said first and second means for selectively allowing said clock pulses to pass therethrough according to one of said complementary gating pulses; fourth means coupled to both said first and second means for selectively allowing said clock pulses to pass therethrough according to the other gating pulse; fifth means coupled to said third means for counting the passed clock pulses and generating a first detecting pulse upon counting the same up to a predetermined number during a predetermined time interval; sixth means coupled to said fourth means for counting the passed clock pulses and generating a second detecting pulse upon counting the same up to said predetermined number during said predetermined time interval; and seventh means coupled to both said fifth and sixth means for resetting said sixth means if said first detecting pulse occurs prior to said second detecting pulse and resetting said fifth means if said second detecting pulse occurs prior to said first detecting pulse.

BRIEF DESCRIPTION OF THE DRAWINGS

These and other objects, features and many of the attendant advantages of this invention will be appreciated more readily as the same becomes better understood by reference to the following detailed description, when considered in connection with the accompanying drawings, wherein like parts in each of the several figures are identified by the same reference characters, and wherein:

FIGS. 1 and 2 are each a schematic circuit diagram of a conventional tone signal detector;

FIG. 3 is a time chart illustrating a proper operation of the circuits of FIGS. 1 and 2;

FIG. 4 is a time chart illustrating improper operation of the circuits of FIGS. 1 and 2;

DETAILED DESCRIPTION OF THE PREFERRED EMBODIMENTS

Figure 5:
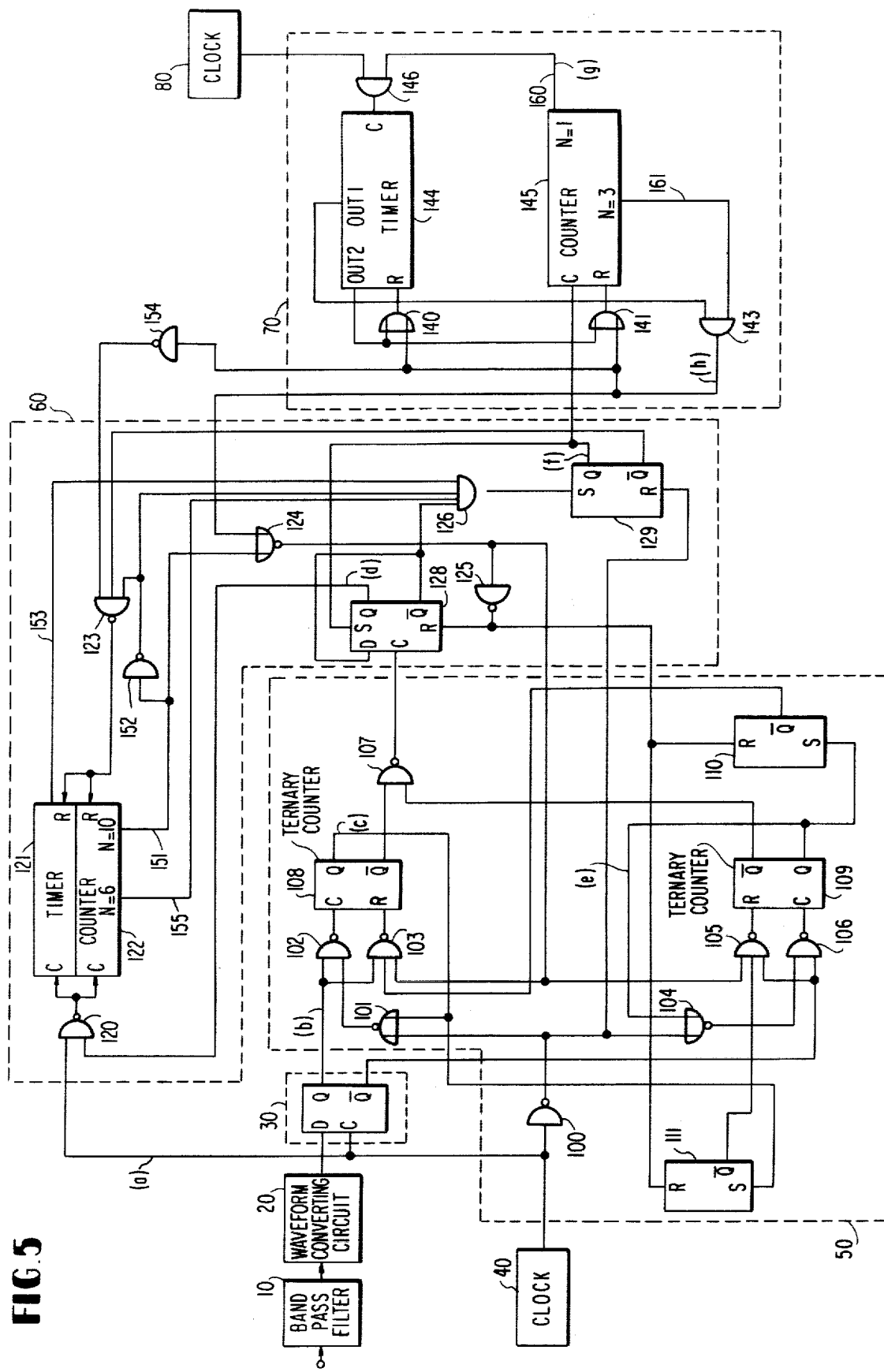
FIG. 5 is a schematic circuit diagram of a first tone signal detector embodying this invention.

The first preferred embodiment of this invention of FIG. 5 will be described in detail in conjunction with waveforms "a" to "h" of FIG. 6. Circuits 10, 20, 30 and 40 of FIG. 5 correspond to the circuits 1, 2, 3 and 4 of FIGS. 1 and 2, respectively. Tone signals are applied, through the band-pass filter 10, to the waveform converting circuit 20 which produces a pulse signal in response to the tone signal applied. The pulse signal from the circuit 20 is then applied to the D input of the synchronizing circuit 30, which is in this embodiment a D type flip-flop for synchronizing the pulse signal with clock pulses "a" applied to the C input from the clock pulse generator 40. Synchronized complementary pulses on Q output (signal "b") and $\bar{Q}$ output of the flip-flop 30 are respectively fed as gating pulses to NAND gates 102 and 106 of counter means within the dotted line box 50. The NAND gates 102 and 106 also receive the clock pulses "a" through a NAND gate 100 and NOR gates 101 and 104 and respond to the gating pulses selectively allowing the clock pulses "a" to be applied to C inputs of counters 108 and 109. The counters 108 and 109 (each being a ternary counter) count the clock pulses "a" fed through the NAND gates 102 and 106, respectively. Assume first that the counter 108 counts three clock pulses before the counter 109 and produces a logic "1" (signal "c") on its Q output. The counter 109 produces a logic "0" (signal "e") on its Q output. The Q output of the counter 108 is connected to one input of the NOR gate 101 so that the logic "1" on the Q output inhibits the NOR gate 101 from passing the clock pulses "a" therethrough regardless of any logical level on the other input. The Q output of the counter 108 is also connected to an S input of an RS flip-flop 111, and so a logic "1" on the Q output of the counter 108 causes the flip-flop 111 to develop a logic "0" which resets the counter 109 via a NAND gate 105. Thus, the counter 109 is cleared to zero, holding a logic "1" on its $\bar{Q}$ output. When the counter 108 counts up to three clock pulses, it produces a logic "0" on its $\bar{Q}$ output. This logic "0" is inverted or complemented by a NAND gate 107 and is applied to a C input of a D-type flip-flop 128 of a frequency determining circuit within the dotted line box 60. The flip-flop 128 emits a logic "1" on its Q output. More specifically, an R input of the flip-flop 128 assumes at this time a logic "0" because a logic "0" on an output terminal 151 of a counter 122 is inverted twice by a NOR gate 124 and finally a NAND gate 125. By the way, the NOR gate 124 assumes at this time a logic "1" because the output level of an AND gate 143 is a logic "0". On the other hand, the S input of the flip-flop 128 assumes a logic "0" according to a Q output of an RS flip-flop 129. As a consequence, a logic "1" on the output of the NAND gate 107 causes the flip-flop 128 to develop a logic "1" (signal "d") on its Q output.

The frequency determining means 60, in brief, functions to determine whether or not the time interval between two consecutive pulses from the NAND gate 107 is within a predetermined range, or in other words, whether or not the frequency of the tone signals applied to the band-pass filter 10 is within a predetermined value. The means 60 produces an output pulse if the time interval is within the predetermined range and otherwise no output.

The logic "1" on the output of the flip-flop 128 selectively permits the clock pulses "a" to be applied to C inputs of both a timer 121 and the counter 122. The time interval of the timer 121 is set to the period of a tone signal to be detected. The timer 121 produces a logic "1" at its terminal 153 during the time interval. Whilst, the counter 122 can count the clock pulses "a" up to ten during the time interval and is set to produce logic "1"s on its output terminal 155 when counting six clock pulses "a".

Suppose in the first place that the tone signal applied to the band-pass filter 10 has a normal or proper frequency and should be detected. As long as the flip-flop 128 assumes a logic "1" on its Q output, the counter 122 counts the clock pulses "a" assuming logic "1" and "0" at the terminals 155 and 151, respectively, and on the other hand, the timer 121 generates a logic "1" on its terminal 153. Consequently, the AND gate 126 receives logic "1" on its three inputs which are coupled to the timer 121 and the counter 122. Accordingly, the Q output of the flip-flop 128 assumes a logic "1", and the flip-flop 128 waits for the next signal. When the second output pulse of the NAND gate 107 develops, the $\bar{Q}$ output of the flip-flop 128 is fed through the AND gate 126 to the S input of the RS flip-flop 129.

As a result, the RS flip-flop 129 produces a logic "1" and "0" on its Q and $\bar{Q}$ outputs, respectively, and reset both the timer 121 and counter 122 through a NAND gate 123. The logic level on the S input of the flip-flop 128 is "1" until the flip-flop 129 is reset.

Let us assume secondly that the tone signal applied to the band-pass filter 10 is higher in frequency than the predetermined signal, in which case the flip-flop 129 should not yield a logic "0" on the $\bar{Q}$ output. In such a case, it is understood that the time duration while the flip-flop 128 assumes a logic "1" on its Q terminal becomes narrower compared with that in the first case. As a result, at least the logical level on the terminal 155 does not change to "1" before the flip-flop 128 changes a logic "1" to "0" on its output Q in response to the second occurrence of a logic "1" from the NAND gate 107. This means that the AND gate 126 is blocked, and so the flip-flop 129 does not produce a logic "1" on its Q output.

Assume finally that the tone signal applied to the band-pass filter 10 is lower in frequency than the predetermined signal, wherein like the above, the flip-flop 129 should not yield a logic "0" on its $\bar{Q}$ output. In this instance, the time duration while the flip-flop 128 assumes a logic "1" on its Q output becomes wider as against that in the first case. Therefore, prior to the aforesaid second occurrence of the logic "1", both the logical level on the terminal 151 and 155 can assume "1", and the timer 121 signals the expiration of the predetermined time interval yielding a logic "0" on its terminal 153. Consequently, the AND gate 126 again does not yield a logic "1". This means that the flip-flop 129 does not assume a logic "1" on its Q output. Thus, the frequency determining means 60 of FIG. 5 can detect the tone signal with a predetermined frequency, while rejecting the others.

Figure 6:
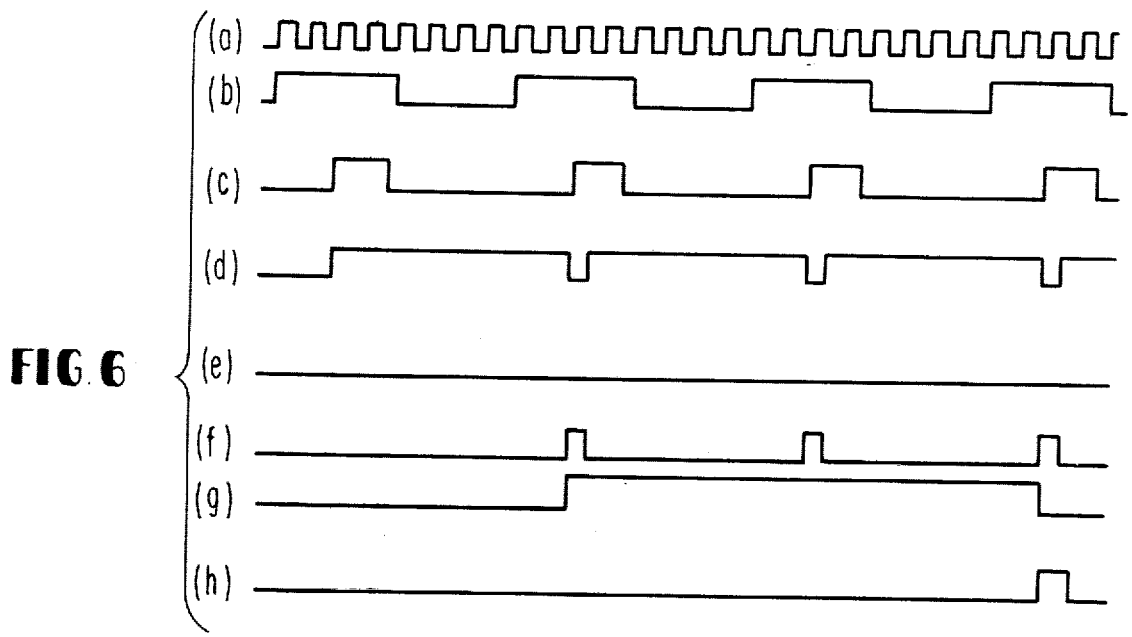
FIG. 6 is a time chart illustrating the operation of the circuit of FIG. 5.

An integrating means within the dotted line box 70 of FIG. 5, comprises two AND gates 143 and 146, OR gates 140 and 141, a timer 144 and a counter 145. The pulses in a logic "1" (signal "f") appearing on the Q output of the flip-flop 129 are applied to a C input of the counter 145 and are counted therein. The counter 145 yields logic "1's" on its terminals 160 and 161 upon counting one and three pulses, respectively. The logic "1" (signal "g") on the terminal 160 causes the AND gate 146 to selectively permit clock pulses from another clock pulse generator 80 to be applied to a C input of the timer 144. The timer 144 has a preset time interval during which the counter 145 can count three applied pulses. Upon counting three pulses, the counter 145 assumes a logic "1" on the terminal 161. Since the timer 144 yields a logic "1" on its terminal OUT 1 until being reset, the counter 145, upon counting the pulses up to three, causes the AND gate 143 to assume a logic "1" (signal "h"), which in turn resets the counters 108, 109, 122 and 145, the flip-flops 110, 111 and 128 and the timers 121 and 144. Thereafter, when the time interval of the timer 144 expires, a logic "1" appears on an output terminal OUT 2 of the timer 144 and resets both the counter 145 and the timer 144.

In the foregoing, if the counter 109 counts three clock pulses "a" before the counter 108, it is apparent that an RS flip-flop 110 is set by the Q output of the flip-flop 109 and causes the counter 108 to be reset through a NAND gate 103. Furthermore, if the frequency determining by the means 60 is not necessarily needed, the frequency determining means 60 and the integrating means 80 can be omitted.

Figure 7:
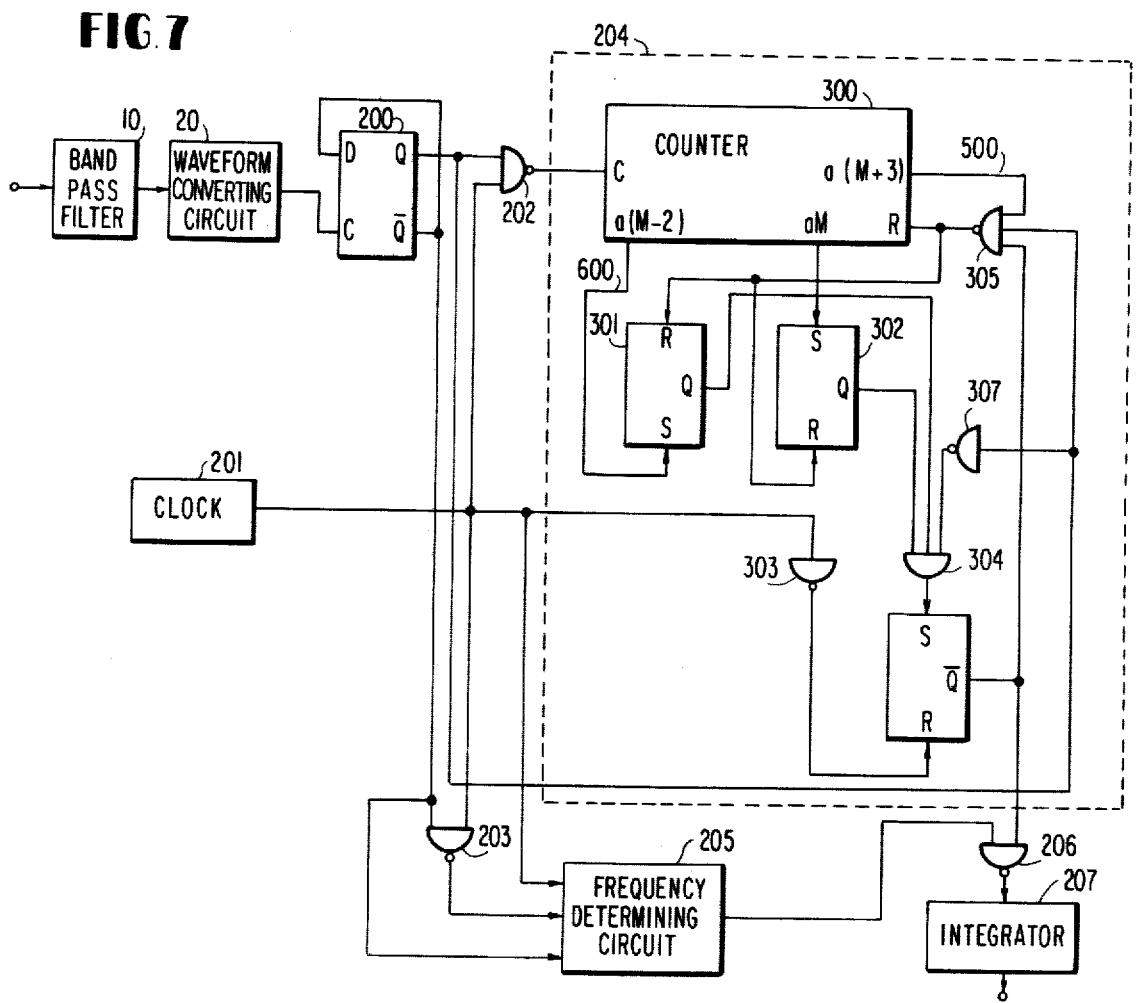
FIG. 7 is a schematic circuit diagram of a second tone signal detector embodying this invention.

FIG. 7 illustrates a second preferred tone signal detector embodying this invention, the feature of which resides in an improved frequency determining circuit 204. The circuit 204, in brief, determines if the period of an incoming tone signal is within a predetermined range, and yields an output signal only if the above condition is satisfied. As previously referred to, tone signals are applied, through the band-pass filter 10, to the waveform converting circuit 20 which converts the incoming tone signal into a rectangular wave. The signal from the circuit 20 is then fed to a C input of a half-frequency divider 200 (for example, a D type flip-flop for compensating for undesirable threshold variations in the circuit 20) so that complementary pulses appearing on the Q and Q outputs of the flip-flop 200 are free from such a problem. The half-frequency divider 200 is known to those skilled in the art, so further description thereof will be omitted for brevity. A NAND gate 202 responds to a logic "1" on the Q output of the D type flip-flop 200 and selectively allows clock pulses from a clock pulse generator 201 to be applied to a C input of a counter 300.

A block 205 is identical to the frequency determining circuit 204 and is supplied with the clock pulses through a NAND gate 203.

The design principle of the frequency determining circuit 204 will hereinafter be discussed. If a period of a desired tone signal is $t_0$, then a period (t) of an actually allowable tone signal is given by the following formula:

$$t_0 - \alpha \leq t \leq t_0 + \beta \quad (1)$$

where $\alpha$ and $\beta$ are positive real numbers and are selected considering intended accuracy. Assuming that a period of a repetition frequency of clock pulses is "a", we obtain $$t_0 = a P \quad (2)$$

where P is a positive real number. Further assuming that the repetition rate is considerably high, then equation (2) can be rewritten as $$t_0 = a M \quad (3)$$

where M is a positive integer nearest to "p". Therefore, substituting the equation (3) into (1) yields $$a(M-2) \leq t \leq a(M+2) \quad (4)$$

where $$a = \alpha/2 = \beta/2.$$

The frequency determining circuit 204 has been designed based on the equation (4).

Assuming, in the first place, that the period of the incoming tone signal is within the predetermined range. As long as the half-frequency divider 200 assumes a logic "1" on the Q output, a C input of a counter 300 (in this case, a(M+3)-nary counter) receives the clock pulses through the NAND gate 202 and yields a logic "1"s on terminals 600 and 700 upon counting the clock pulses up to a(M−2) and aM, respectively. The logic "1"s on the terminals 600 and 700 set RS flip-flops 301 and 302, respectively, so that these flip-flops 301 and 302 assume logic "1"s on their Q outputs. The terminal 500 of the counter 300 assume logic "1" until the counter 300 counts a(M+3). Under these conditions, when the output signal from the half-frequency divider 200 changes its logic state (i.e., to logic "0"), the AND gate 304 assumes logic "1" depending on the Q outputs of the flip-flops 301 and 302 and the output of a NAND 307 and sets an RS flip-flop 306. An output signal in a logic "0" from the flip-flop 306 is then fed through a NAND gate 206 to an integrator 207 which integrates the output signal and which is similar to the integrating means 70 of FIG. 5 so that further description will be omitted for simplicity. A NAND gate 305 assumes a logic "1" and resets the counter 300 and the RS flip-flops 301 and 302.

Secondly, suppose that the incoming tone signal has a short period so that it should not be detected. In this case, before the two flip-flops 302 and 301 are set, the counter 300 is reset in response to an inverted state of the signal from the half-frequency divider 200. Therefore, all the inputs of the AND gate 304 are not in a logic "1" simultaneously so that the AND gate 304 does not assume a logic "1" on its output. Thus, the above undesirable input signal is not detected.

Thirdly, on the other hand, assuming that the incoming tone signal has a long period so that it should not be detected just as in the second case. In this instance, although both the flip-flops 301 and 302 can be set and assuming logic "1's" on their Q outputs, the counter 300 counts up to a(M+3) and causes the flip-flops 301 and 302 to return to their original states before the signal from the half-frequency divider 200 is complemented. It is, therefore, understood that the above undesirable input signal is not detected as well.

In FIG. 7, the output signals of the circuits 204 and 205 are fed to the integrator 207 in order to increase the accuracy of detecting the predetermined tone signals. However, such an integration requires a certain amount of time, so that the two circuits 204 and 205 are provided in FIG. 7 to shorten the detecting time. If the detecting is not necessarily carried out in a short time in comparison with the above, either of the circuits 204 and 205 can be omitted.

Although only preferred embodiments of this invention are described and illustrated hereinbefore, various modifications can be made by those skilled in the art without departing from the subject matter of this invention. For example, the counters 108 and 109 may be other than ternary counters, and the half-frequency divider 200 can be generally substituted by a 1/K-frequency divider (K is an integer greater than two). Further, the clock pulse generator 40 can be connected to the one input of the AND gate 146 to eliminate clock pulse generator 80.

What is claimed is:

1. A tone signal detector for detecting the presence of predetermined tone signals, comprising:
    first means for waveform-converting applied tone signals to generate complementary gating pulses;
    second means for generating clock pulses;
    third means coupled to both said first and second means for selectively passing said clock pulses according to one of said complementary gating pulses;
    fourth means coupled to both said first and second means for selectively passing said clock pulses to pass therethrough according to the other of said complementary gating pulse;
    fifth means coupled to said third means for counting the passed clock pulses and generating a first detecting pulse upon counting the same up to a predetermined number during a predetermined time interval;
    sixth means coupled to said fourth means for counting the passed clock pulses and generating a second detecting pulse upon counting the same up to said predetermined number during said predetermined time interval; and
    seventh means coupled to both said fifth and sixth means for resetting said sixth means if said first detecting pulse occurs prior to said second detecting pulse and resetting said fifth means if said second detecting pulse occurs prior to said first detecting pulse.

2. Tone signal detector as claimed in claim 1, further comprising eighth means for counting said clock pulses in response to said first and second detecting pulses and generating a third detecting pulse upon counting the same up to a predetermined number during a predetermined time interval.

3. A tone signal detector for detecting the presence of predetermined tone signals, comprising:
    first means for waveform-converting applied tone signals to generate a sequence of pulses;
    second means for generating clock pulses;
    third means coupled to said first means for receiving said pulses and frequency-dividing the same by a factor of 1/K, K being an integer greater than one, and generating complementary gating pulses;
    fourth means coupled to both said second and third means for selectively passing said clock pulses to pass therethrough according to one of said complementary gating pulses;
    fifth means coupled to both said second and third means for selectively passing said clock pulses to pass therethrough according to the other of said complementary gating pulses;
    sixth means coupled to said fourth means for counting the passed clock pulses and generating a first detecting pulse upon counting the same up to a predetermined number during a predetermined time interval;
    seventh means coupled to said fifth means for counting the passed clock pulses and generating a second detecting pulse upon counting the same up to said predetermined number during said predetermined time interval; and
    eighth means coupled to said second, sixth and seventh means for counting said clock pulses in response to said first and second detecting pulses and generating a third detecting pulse upon counting the clock pulses up to a predetermined number during a predetermined time interval.

* * * * *